(12) United States Patent
Choi et al.

(10) Patent No.: US 7,960,774 B2
(45) Date of Patent: *Jun. 14, 2011

(54) MEMORY DEVICES INCLUDING DIELECTRIC THIN FILM AND METHOD OF MANUFACTURING THE SAME

(75) Inventors: Sung-Yool Choi, Daejeon (KR); Min Ki Ryu, Seoul (KR); Ansoon Kim, Daejeon (KR); Chil Seong Ah, Daejeon (KR); Han Young Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 248 days.

This patent is subject to a terminal disclaimer.

(21) Appl. No.: 11/607,500

(22) Filed: Dec. 1, 2006

(65) Prior Publication Data

US 2007/0126045 A1 Jun. 7, 2007

(30) Foreign Application Priority Data

Dec. 5, 2005 (KR) .................. 10-2005-0117717
May 17, 2006 (KR) .................. 10-2006-0044063

(51) Int. Cl.
*H01L 29/94* (2006.01)

(52) U.S. Cl. ......... 257/310; 257/E21.009; 257/E21.008; 257/E27.104; 257/E21.662; 257/E21.679

(58) Field of Classification Search .............. 257/310
See application file for complete search history.

(56) References Cited

U.S. PATENT DOCUMENTS

| | | | |
|---|---|---|---|
| 6,077,729 A | 6/2000 | Harshfield | |
| 6,117,720 A | 9/2000 | Harshfield | |
| 6,172,385 B1 | 1/2001 | Duncombe et al. | |
| 6,381,119 B1 | 4/2002 | Katori | |
| 6,777,705 B2 | 8/2004 | Reinberg et al. | |
| 6,794,764 B1 * | 9/2004 | Kamal et al. | 257/310 |
| 6,812,084 B2 | 11/2004 | King | |
| 7,038,284 B2 | 5/2006 | Haukka et al. | |
| 2004/0238861 A1 * | 12/2004 | Hwang et al. | 257/295 |
| 2005/0029579 A1 * | 2/2005 | Mori | 257/315 |
| 2010/0065803 A1 * | 3/2010 | Choi et al. | 257/4 |

FOREIGN PATENT DOCUMENTS

| | | |
|---|---|---|
| JP | 06-151601 | 5/1994 |
| JP | 2002-203917 | 7/2002 |
| JP | 2003-309250 | 10/2003 |
| JP | 2004-185756 | 7/2004 |
| KR | 1020000022925 A | 4/2000 |
| KR | 10-2004-0049290 | 6/2004 |
| KR | 1020060083368 A | 7/2006 |
| KR | 1020070058939 A | 6/2007 |

OTHER PUBLICATIONS

Rozenberg, M.J., et al., "Nonvolatile Memory with Multilevel Switching: A Basic Model." Apr. 30, 2004. *Physical Review Letters*, vol. 92, No. 17, pp. 178302-1-178302-4. Odgawa, A., et al., "Colossal electroresistance of a Pr0.7Ca0.3MnO3 thin film at room temperature." 2004. *Physical Review B*, vol. 70, pp. 224403-1-224403-4.
Rose, A., "Space-Charge-Limited Currents in Solids." Mar. 15, 1955. *Physical Review*, vol. 97, No. 6, pp. 1538-1544.
Written Opinion of the International Searching Authority: PCT/KR2007/006062.
International Search Report: PCT/KR2007/006062.

* cited by examiner

*Primary Examiner* — David Vu
*Assistant Examiner* — Suberr Chi
(74) *Attorney, Agent, or Firm* — Ladas & Parry LLP

(57) ABSTRACT

A memory device including a dielectric thin film having a plurality of dielectric layers and a method of manufacturing the same are provided. The memory device includes: a bottom electrode; at least one dielectric thin film disposed on the bottom electrode and having a plurality of dielectric layers with different charge trap densities from each other; and an top electrode disposed on the dielectric thin film. Therefore, a memory device, which can be readily manufactured by a simple process and can be highly integrated using its simple structure, can be provided.

9 Claims, 4 Drawing Sheets

US 7,960,774 B2

MEMORY DEVICES INCLUDING DIELECTRIC THIN FILM AND METHOD OF MANUFACTURING THE SAME

CROSS-REFERENCE TO RELATED APPLICATION

This application claims priority to and the benefit of Korean Patent Application Nos. 2005-117717, filed Dec. 5, 2005, and 2006-44063, filed May 17, 2006, the disclosures of which are incorporated herein by reference in their entirety.

BACKGROUND

1. Field of the Invention

The present invention relates to a memory device and a method of manufacturing the same, and more particularly, to a memory device including a dielectric thin film having a plurality of dielectric layers and a method of manufacturing the same.

2. Discussion of Related Art

Non-volatile memory devices are information storage devices typically employed in cellular phones, digital cameras, MP3 players, and the like. The use of non-volatile memory devices in these and various other devices is extremely widespread, and demand for mass storage of data is recently increasing. In addition, non-volatile memory devices are commonly used in mobile devices which require that they operate at low power.

Flash memory devices, which control accumulation of charge on a floating gate to store data, are the most widespread type of non-volatile memory device. However, since flash memory devices have a structure in which charge is accumulated on a floating gate in the presence of a strong electric field, the device structure becomes relatively complicated and difficult to densely integrate.

To overcome this problem, the Ovonic Unified Memory (OUM), an electrically erasable non-volatile memory device, was proposed. The OUM uses a difference in electrical conductivity between a crystalline state and a non-crystalline state of a memory layer, and has a simple structure compared to a flash memory so that it can be highly integrated in theory. However, heat is required for a phase change from the crystalline state to the noncrystalline state of the memory layer in the OUM, which requires a current of about 1 mA per cell. Consequently, thick interconnections are required, which again makes it difficult to obtain high integration.

To cope with this problem, non-volatile memory devices allowing an electrical resistance to change without a phase change are disclosed in Korean Patent Publication No. 2004-0049290 and Japanese Laid-Open Patent Publication No. 2004-185756. The non-volatile memory devices disclosed in these documents are based on the principle of forming an oxide having a perovskite structure containing Mn and applying a voltage pulse to change electrical resistance.

However, materials such as Mn oxide layers disclosed in the cited documents (e.g., PrCaMnO, LaCaMnO, LaCaPbMnO, or the like) require a high process temperature and have complicated structures. Consequently, manufactured structures may easily deviate from what is necessary for the memory device to function properly. Accordingly, such devices are difficult to manufacture.

SUMMARY OF THE INVENTION

The present invention is directed to a method of a manufacturing memory device, capable of manufacturing a non-volatile memory device using a simple manufacturing process. The present invention is also directed to a memory device, which can be highly integrated by a simple manufacturing process.

One aspect of the present invention provides a memory device, comprising: a bottom electrode; at least one dielectric thin film disposed on the bottom electrode and having a plurality of dielectric layers with different charge trap densities from each other; and an top electrode disposed on the dielectric thin film.

Preferably, different space-charge limit currents may flow in the dielectric thin film according to the charge trap densities. The space-charge limit current may be controlled according to an impurity added to the dielectric layer. The dielectric layer may use a dielectric formed of $TiO_2$, $ZrO_2$, $HfO_2$, $V_2O_5$, $Nb_2O_5$, $Ta_2O_5$, NiO, PdO, or a material in which at least one of Ti, V, Cr, Mn, Fe, Co, Ni, Cu, Zn, Zr, Hf, Nb, Ta, Pd, and La group elements is added to $TiO_2$, $ZrO_2$, $HfO_2$, $V_2O_5$, $Nb_2O_5$, $Ta_2O_5$, NiO, or PdO, as an impurity; a dielectric of $ABO_3$ type; or a dielectric consisting of a material having a perovskite structure except the $ABO_3$ type, and impurities added to the material. The charge trap density may range from $10^{17}/cm^3$ to $10^{21}/cm^3$. The dielectric thin film may be formed to a thickness of 3 nm to 100 nm. The dielectric constant of the dielectric layer may range from 3 to 1000.

Another aspect of the present invention provides a method of manufacturing a memory device, comprising the steps of: forming a bottom electrode; forming at least one dielectric thin film having a plurality of dielectric layers with different charge trap densities from each other on the bottom electrode; and forming an top electrode on the dielectric thin film.

Preferably, the step of forming the dielectric thin film may comprise the steps of: forming a lower dielectric layer on the bottom electrode; and forming an upper dielectric layer using a dielectric equal to or different from the lower dielectric layer on the lower dielectric layer. The step of forming the dielectric thin film may comprise the step of forming an intermediate dielectric layer using a dielectric equal to at least one of the lower and upper dielectric layers or a dielectric different from the lower and upper dielectric layers, between the lower dielectric layer formed on the bottom electrode and the upper dielectric layer formed on the lower dielectric layer.

The intermediate dielectric layer may act as a dielectric which prevents traps included in the lower and upper dielectric layers from moving. When the lower dielectric layer, the intermediate dielectric layer, and the upper dielectric layer are formed of the same dielectric, deposition conditions of the respective dielectric layers may be made to be different from each other. The deposition condition may be at least one of a deposition temperature, a deposition time, a deposition rate and a deposition method. The dielectric thin film may have a thickness of 3 nm to 100 nm. The dielectric layer may be formed of a dielectric having a dielectric constant in a range of 3 to 1000. The dielectric layer may use a dielectric formed of $TiO_2$, $ZrO_2$, $HfO_2$, $V_2O_5$, $Nb_2O_5$, $Ta_2O_5$, NiO, PdO, or a material in which at least one of Ti, V, Cr, Mn, Fe, Co, Ni, Cu, Zn, Zr, Hf, Nb, Ta, Pd, and La group elements is added to $TiO_2$, $ZrO_2$, $HfO_2$, $V_2O_5$, $Nb_2O_5$, $Ta_2O_5$, NiO, or PdO, as an impurity; a dielectric of $ABO_3$ type; or a dielectric consisting of a material having a perovskite structure except the $ABO_3$ type, and impurities added to the material.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, memory devices according to exemplary embodiments of the present invention will be described in detail with reference to accompanying drawings.

Figure 1:
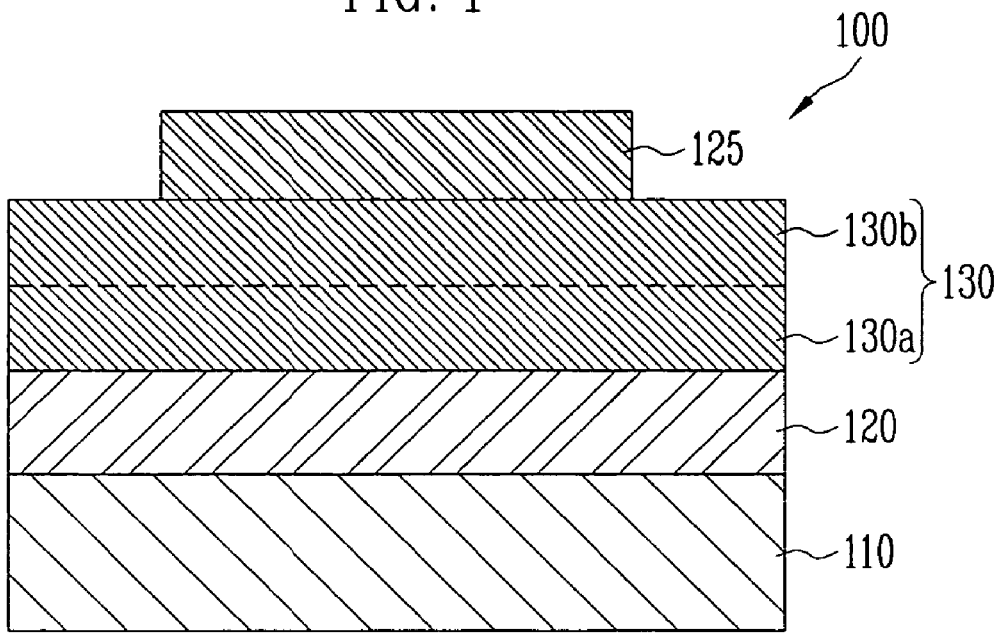
FIG. 1 is a schematic side cross-sectional view of a memory device having a dielectric thin film in accordance with an embodiment of the present invention.

FIG. 1 is a schematic side cross-sectional view of a memory device having a dielectric thin film in accordance with an embodiment of the present invention. Referring to FIG. 1, the memory device 100 according to an embodiment of the present invention includes a substrate 110, a bottom electrode 120 disposed on the substrate 110, a dielectric thin film 130 disposed on the bottom electrode 120, and an top electrode 125 disposed thereon. The dielectric thin film 130 shown in FIG. 1 includes a lower dielectric layer 130a and an upper dielectric layer 130b.

The dielectric thin film 130 having a plurality of dielectric layers 130a and 130b using the same dielectric is shown in FIG. 1. As shown in FIG. 1, when the same dielectric is used, the dielectric layers having different trap charge densities can be formed by making deposition conditions (e.g., deposition temperature, deposition time, deposition rate, deposition method, or the like) different from each other for each dielectric layer in consideration of intrinsic defects generated due to lack or excess of specific atoms among atoms constituting a material or extrinsic defects generated due to doped impurities.

Figure 2:
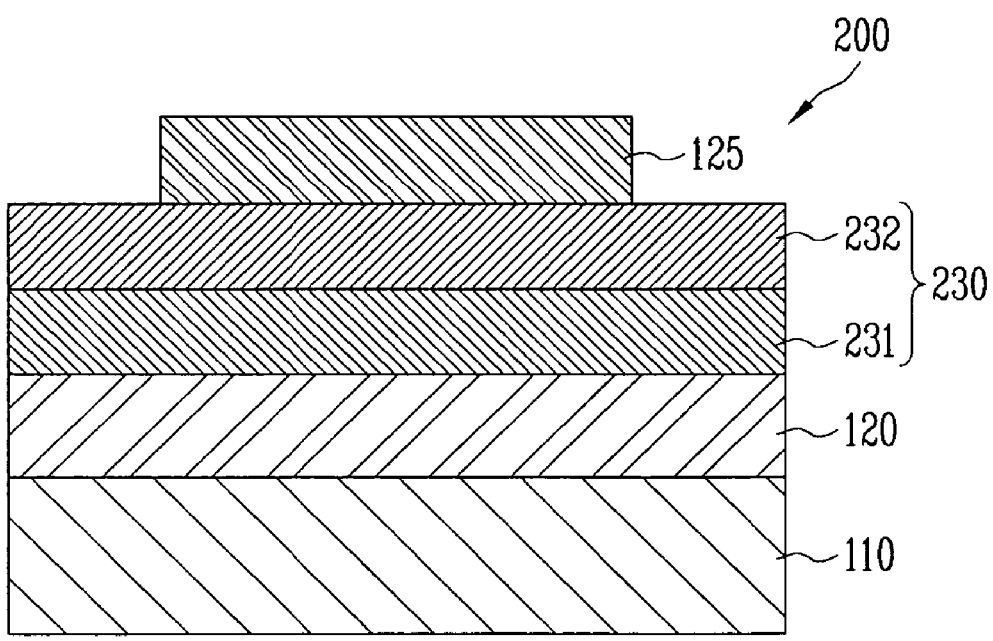
FIG. 2 is a schematic side cross-sectional view of a memory device having a dielectric thin film in accordance with another embodiment of the present invention.

FIG. 2 is a schematic side cross-sectional view of a memory device having a dielectric thin film in accordance with another embodiment of the present invention. Referring to FIG. 2, a memory device 200 according to another embodiment of the present invention includes a substrate 110, a bottom electrode 120 disposed on the substrate 110, a dielectric thin film 230 disposed on the bottom electrode 120, and an top electrode 125 disposed thereon. The dielectric thin film 230 shown in FIG. 2 includes a lower dielectric layer 231 and an upper dielectric layer 232.

The dielectric thin film 230 having a plurality of dielectric layers 231 and 232 using different dielectrics is shown in FIG. 2. When the different dielectrics are used, the same deposition condition and different deposition conditions can be used, and different dielectric layers can be formed even when the same deposition condition is used.

Referring to FIGS. 1 and 2, the memory devices 100 and 200 of the present invention have a thin film type condenser structure, which has the dielectric thin films 130 and 230 composed of a plurality of stacked dielectric layers 130a and 130b, and 231 and 232 and having a predetermined dielectric constant between the bottom electrode 120 and the top electrode 125. The dielectric layers 130a and 130b, and 231 and 232 use a dielectric having a dielectric constant of 3 to 1000, and the dielectric thin films 130 and 230 are preferably formed to a relatively thin thickness so as to form a relatively large electric field with respect to a voltage applied to the memory device. In the present embodiment, the dielectric thin films 130 and 230 are formed to a thickness of 3 nm to 100 nm, and may be formed of organic materials as well as inorganic materials.

Electrical characteristics of the lower dielectric layers 130a and 231 constituting the dielectric thin films 130 and 230 are different from those of the upper dielectric layers 130b and 232 constituting the dielectric thin films 130 and 230 according to a direction of an applied voltage. For example, the lower dielectric layers 130a and 231 and the upper dielectric layer 130b and 232 may be manufactured so as to have a characteristic that a trap-unfilled space charge limited current (SCLC) flows in a state that charges are discharged from a trap present within the dielectric thin film and a characteristic that a trap-filled SCLC flows in a state that charges are filled within the trap, according to the direction of the applied voltage. In addition, the dielectric thin films 130 and 230 may be manufactured to have a characteristic that traps are hardly found in the dielectric thin films 130 and 230, a characteristic that there are many traps for capturing electrons, a characteristic that there are many traps for capturing holes, or a proper combination thereof.

When the charge trap density per unit volume of each dielectric layer is not less than a predetermined level as described above, currents flow through the dielectric thin films 130 and 230 due to the SCLC which is an electrical transport characteristic. The charge trap density per unit volume ranges from $10^{17}/cm^3$ to $10^{21}/cm^3$ in the present embodiment.

Meanwhile, impurity ions are doped on the dielectric layer in order to control the SCLC. The dielectric layer is composed of $TiO_2$, $ZrO_2$, $HfO_2$, $V_2O_5$, $Nb_2O_5$, $Ta_2O_5$, NiO, PdO, or a material in which at least one of Ti, V, Cr, Mn, Fe, Co, Ni, Cu, Zn, Zr, Hf, Nb, Ta, Pd, and La group elements is added to $TiO_2$, $ZrO_2$, $HfO_2$, $V_2O_5$, $Nb_2O_5$, $Ta_2O_5$, NiO, or PdO, as an impurity. In addition, in order to form the dielectric layer, a dielectric of $ABO_3$ type (e.g., (Group 1 element)(Group 5 element)$O_3$ or (Group 2 element)(Group 4 element)$O_3$) may be used. In this case, the dielectrics of (Group 1 element)(Group 5 element)$O_3$ include $LiNbO_3$, $LiTaO_3$, $NaNbO_3$, ... $(Li,Na)(Nb,Ta)O_3$, $(Li,Na,K)(Nb,Ta)O_3$, and so forth, and the dielectrics of (Group 2 element)(Group 4 element)$O_3$ include $CaTiO_3$, $SrTiO_3$, $BaTiO_3$, $PbTiO_3$, ..., $Pb(Zr,Ti)O_3$, ... $(Ca,Sr,Ba,Pb)(Ti,Zr)O_3$, $YMnO_3$, $LaMnO_3$, and so forth. In another embodiment, the dielectric layer may use a dielectric consisting of a material (e.g., $Bi_4Ta_3O_{12}$, ... $(Sr,Ba)Nb_2O_6$ or the like) having a perovskite structure except the $ABO_3$ type, and impurities added to the material. A dielectric constant of the dielectric layer is selected in a range of 3 to 1000, and the dielectric of $ABO_3$ type is a ferroelectric having a relatively high dielectric constant compared to other materials and has a dielectric constant of about 100 to about 1000, and the rest of the dielectrics have a dielectric constant of 3 to several hundreds.

Figure 3:
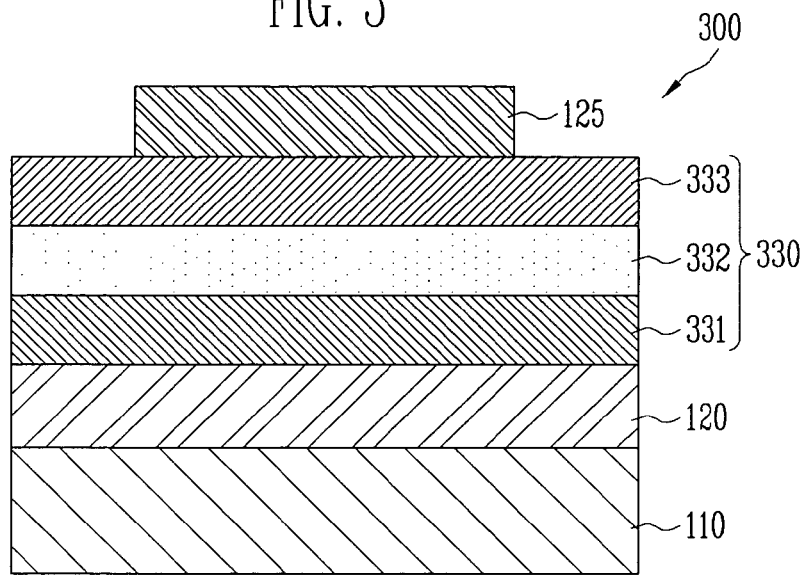
FIG. 3 is a schematic side cross-sectional view of a memory device having a dielectric thin film in accordance with yet another embodiment of the present invention.

FIG. 3 is a schematic side cross-sectional view of a memory device having a dielectric thin film in accordance with yet another embodiment of the present invention. Referring to FIG. 3, a memory device 300 includes a substrate 110, a bottom electrode 120 disposed on the substrate 110, a dielectric thin film 330 disposed on the bottom electrode 120, and an top electrode 125 disposed on the dielectric thin film 330. The dielectric thin film 330 shown in FIG. 3 includes a lower dielectric layer 331, an intermediate dielectric layer 332 disposed on the lower dielectric layer 331, and an upper dielectric layer 333 disposed on the intermediate dielectric layer 332.

The memory device 300 according to the present embodiment also has a thin film type condensor structure, which includes a dielectric thin film 330 composed of a plurality of dielectric layers 331, 332, and 333 having a predetermined dielectric constant between the bottom electrode 120 and the top electrode 125 in the same way as the memory devices 100 and 200 shown in FIGS. 1 and 2. The dielectric layers 331, 332, and 333 are formed of a dielectric having a dielectric constant of 3 to 1000, and may be formed of the same material as that described with reference to FIGS. 1 and 2. The dielectric thin film 330 is preferably formed to a relatively thin thickness so as to form a relatively large electric field with respect to a voltage applied to the memory device 300, and the dielectric thin film 330 can be formed to a thickness of 3 nm to 100 nm in the present embodiment. For simplicity of description, electrical characteristics of the lower dielectric layer 331 and the upper dielectric layer 333 and description of the same constitutional elements as those of FIGS. 1 and 2 can be referred to the description of FIGS. 1 and 2.

In addition, the intermediate dielectric layer 332 formed on the lower dielectric layer 331 acts as a barrier for preventing traps included in the lower dielectric layer 331 and the upper dielectric layer 333 from moving to another dielectric layer. Consequently, the intermediate dielectric layer 332 prevents the traps from moving to the dielectric layer having a different trap charge density, so that the memory effect is enhanced. The intermediate dielectric layer 332 of FIG. 3 may be formed of a dielectric material different from each of the upper dielectric layer 333 and the lower dielectric layer 331, or may be formed of the same dielectric material as one of the upper dielectric layer 333 and the lower dielectric layer 331. When the same dielectric material is used, deposition can be carried out using different deposition conditions (e.g., deposition temperature, deposition time, deposition rate, deposition method, or the like) per each dielectric layer to form dielectric layers having different trap charge densities from each other. A detailed description of the charge trap density and the material for forming the dielectric layer will also be referred to the descriptions of FIGS. 1 and 2.

As described above, in the memory devices 100, 200, 300 manufactured including the bottom electrode 120, the dielectric thin films 130, 230, and 330, and the top electrode 125, an electrical conductivity is changed according to a voltage applied between the bottom electrode 120 and the top electrode 125. The state of the electrical conductivity of the dielectric layer is kept even when the voltage is not applied thereto. To detail this, a high conductivity is kept when the electrical conductivity of the dielectric layer is in a high conductivity state, and a low conductivity is kept when the electrical conductivity of the dielectric layer is in a low conductivity state.

The dielectric thin films 130, 230, and 330 will now be described in detail. In general, current hardly flows through a dielectric unlike metal and semiconductor. However, a strong electric field is generated when a voltage is applied to very thin dielectric thin films 130, 230, and 330. In this case, an ohmic current that the current is in proportion to the voltage ($I \propto V$) flows when a low voltage is applied to the dielectric thin films 130, 230, and 330, and an SCLC that the current is in proportion to the square of the voltage flows when a high voltage is applied to the dielectric thin films. When a charge trap due to an impurity is present in the dielectric thin film, the SCLC is determined by Equation 1 below.

$$J = \frac{9}{8}\varepsilon\mu\theta\frac{V^2}{d^3} \qquad \text{Equation 1}$$

wherein, J denotes a current density, $\in$ denotes a dielectric constant, $\mu$ denotes a charge mobility, V denotes a voltage, and d denotes a thickness. $\theta$ denotes a ratio between a free charge density (n) and a trapped charge density ($n_t$), which is given as Equation 2 below.

$$\theta = \frac{n}{n_t} \qquad \text{Equation 2}$$

VT (threshold voltage, see FIG. 5) denotes a trap-filled limit voltage ($V_{TFL}$), and complies with Equation 3 below.

$$V_{TFL} = \frac{eN_t d^2}{2\varepsilon} \qquad \text{Equation 3}$$

wherein $N_t$ denotes a trap density.

According to Equation 3, in case of memory device using an SCLC, the threshold voltage and current flowing through the memory device can be controlled by adjusting a dielectric constant of the dielectric layer, a trap density, a thickness of the dielectric layer, or the like. The charge trap captures only one kind of charge of an electron and a hole, and when such traps are distributed in an irregular way at upper and lower sides within the thin film, the current flowing in the thin film can be divided into a trap-filled SCLC and a trap-unfilled SCLC according to a direction of a voltage that is applied from the exterior. Conductivities of the two states are different from each other, and can be switched to different states from each other at the threshold voltage ($V_T$, $V^*_T$) or more. Such a phenomenon can be employed to manufacture a variable resistance type memory device. In this case, performance of the non-volatile memory can be controlled according to the kind of the dielectric and the trap characteristics.

When several dielectric layers having different characteristics are manufactured in a multilayered thin film structure in accordance with the present embodiment, effective voltages ($V_1, V_2, \ldots$) applied to the respective layers can be controlled by Equation 4 below, and therefore, the non-volatile memory device having good characteristics can be manufactured.

$$\begin{aligned} Q &= CV, \\ V &= V_1 + V_2 + \ldots, \\ \frac{1}{C} &= \frac{1}{C_1} + \frac{1}{C_2} + \ldots, \\ \frac{C}{A} &= \frac{\varepsilon_0 \varepsilon_1}{d_1} = \frac{\varepsilon_0 \varepsilon_2}{d_2} \end{aligned} \qquad \text{Equation 4}$$

wherein Q denotes the amount of charge, V denotes a voltage, C denotes a capacitance, A denotes a current, d denotes a thickness, and ∈ denotes a dielectric constant. Accordingly, the whole characteristics of the device can be changed when each thickness is changed.

As described above, when at least two dielectric thin films are stacked to manufacture the memory device, degradation of the characteristics of the memory device can be controlled. When a plurality of dielectric thin films are used to manufacture the memory device, the upper dielectric layer constituting the lower dielectric thin film and the lower dielectric layer constituting the upper dielectric thin film can be controlled according to Equation 4, i.e., the intensity of an electric field applied to each layer can be determined according to the thickness and dielectric constant of each dielectric layer.

Figure 4:
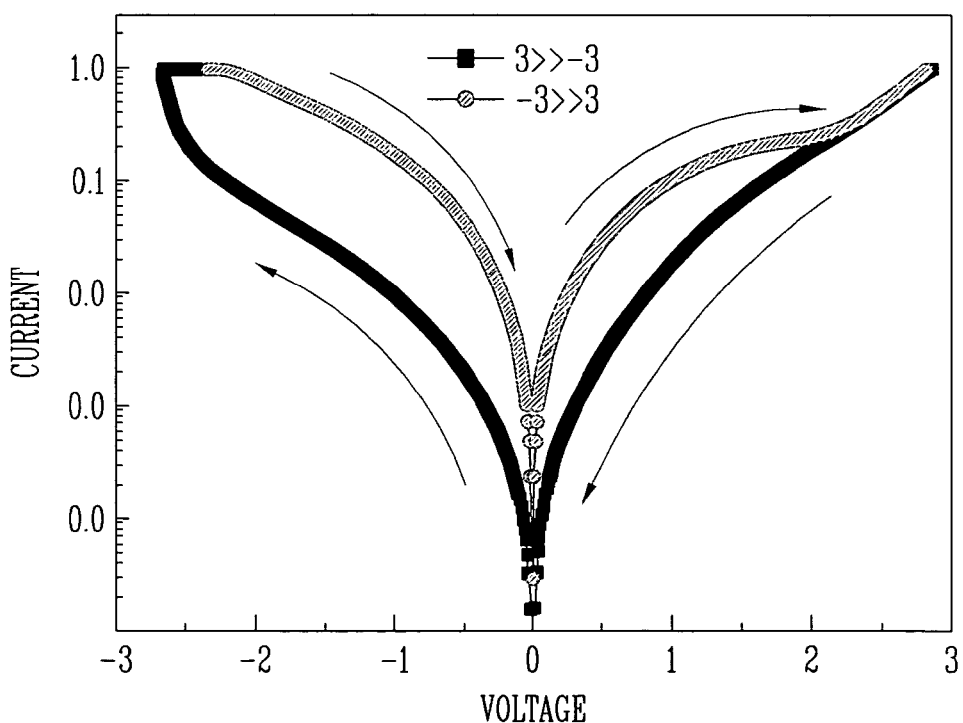
FIG. 4 is a graph of log I versus V of a memory device in accordance with an embodiment of the present invention.

FIG. 4 is a graph of log I versus V of a memory device in accordance with an embodiment of the present invention. FIG. 4 is a graph showing current—voltage characteristics of the memory device, and its vertical axis denotes log I (current), and its horizontal axis denotes a voltage. Referring to the graph, after a negative voltage is applied, i.e., when 3V is changed to −3V (3V→−3V), the trap-filled SCLC flows to decrease resistance, however, after a positive is applied, that is, when −3V is changed to 3V (−3V→3V), the trap-unfilled SCLC flows to increase resistance.

Figure 5:
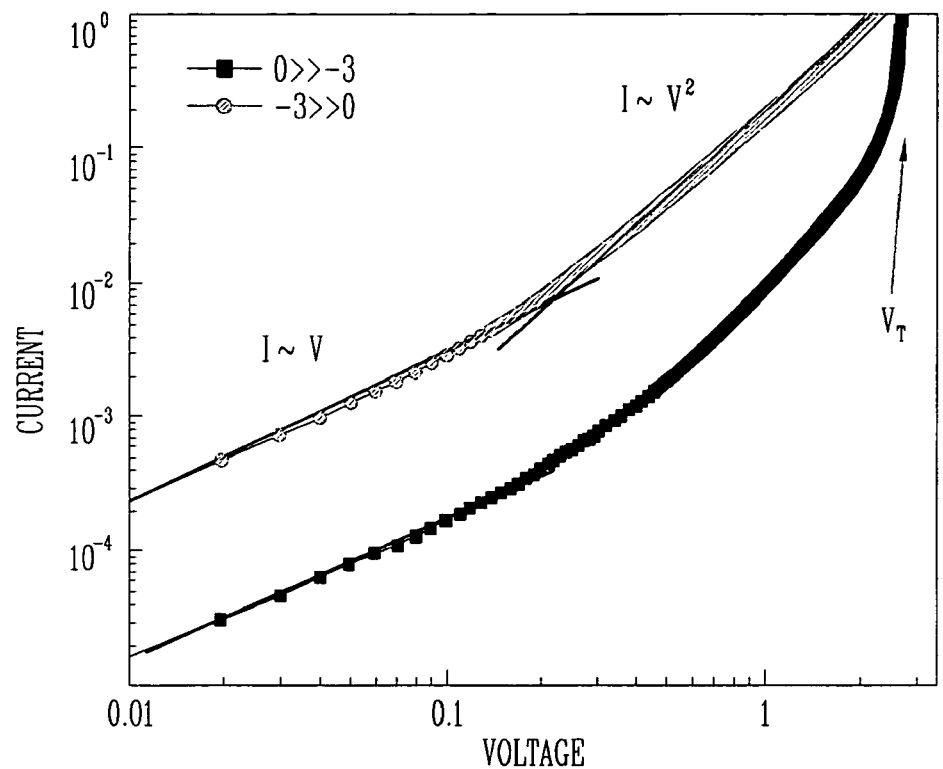
FIG. 5 is a logarithmic graph of current I versus voltage V when a negative voltage is applied to a memory device in accordance with an embodiment of the present invention.

FIG. 5 is a logarithmic graph of current I versus voltage V when a negative voltage is applied to a memory device in accordance with an embodiment of the present invention. When a voltage applied to the memory device goes from 0V to −3V and from −3V to 0V, an ohmic current having a slope of almost 1 flows at a low voltage. However, the slope slowly increases at higher voltages and rapidly increases when it reaches the threshold voltage (VT). At this point the state changes from the trap-unfilled SCLC to the trap-filled SCLC. Afterwards, a low resistance is kept at a negative voltage of magnitude smaller than $V_T$ because of the trap-filled SCLC.

Figure 6:
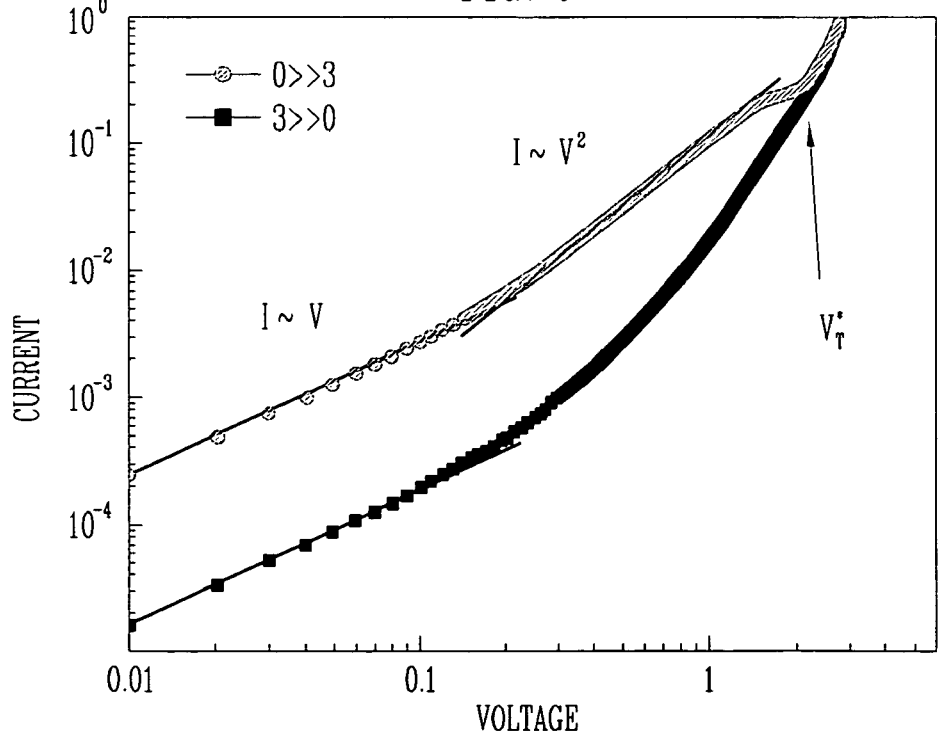
FIG. 6 is a logarithmic graph of current I versus voltage V when a positive voltage is applied to a memory device in accordance with an embodiment of the present invention.

FIG. 6 is a logarithmic graph of current I versus voltage V when a positive voltage is applied to a memory device in accordance with an embodiment of the present invention. When the voltage applied to the memory device increases from 0V to 3V, an ohmic current having a slope of 1 flows at a low voltage, and the state changes to the trap-filled SCLC state at a high voltage. And, the voltage decreases with a lesser slope at the threshold voltage ($V_T^*$) so that the state changes from the trap-filled SCLC to the trap-unfilled SCLC. Afterwards, a state having a high resistance is kept due to the trap-unfilled SCLC at a positive voltage and a negative voltage of lesser magnitude than the threshold voltage.

When characteristics of the memory device of FIGS. 4 to 6 are under test, a limit current of 1 mA is applied to measurement equipment for measuring the characteristics of the memory device to prevent the memory device from being damaged. Therefore, a voltage of about −2.7V to about 2.9V is actually applied to the measurement equipment even when ±3V is applied thereto, so that the memory device itself can be prevented from being damaged.

Figure 7:
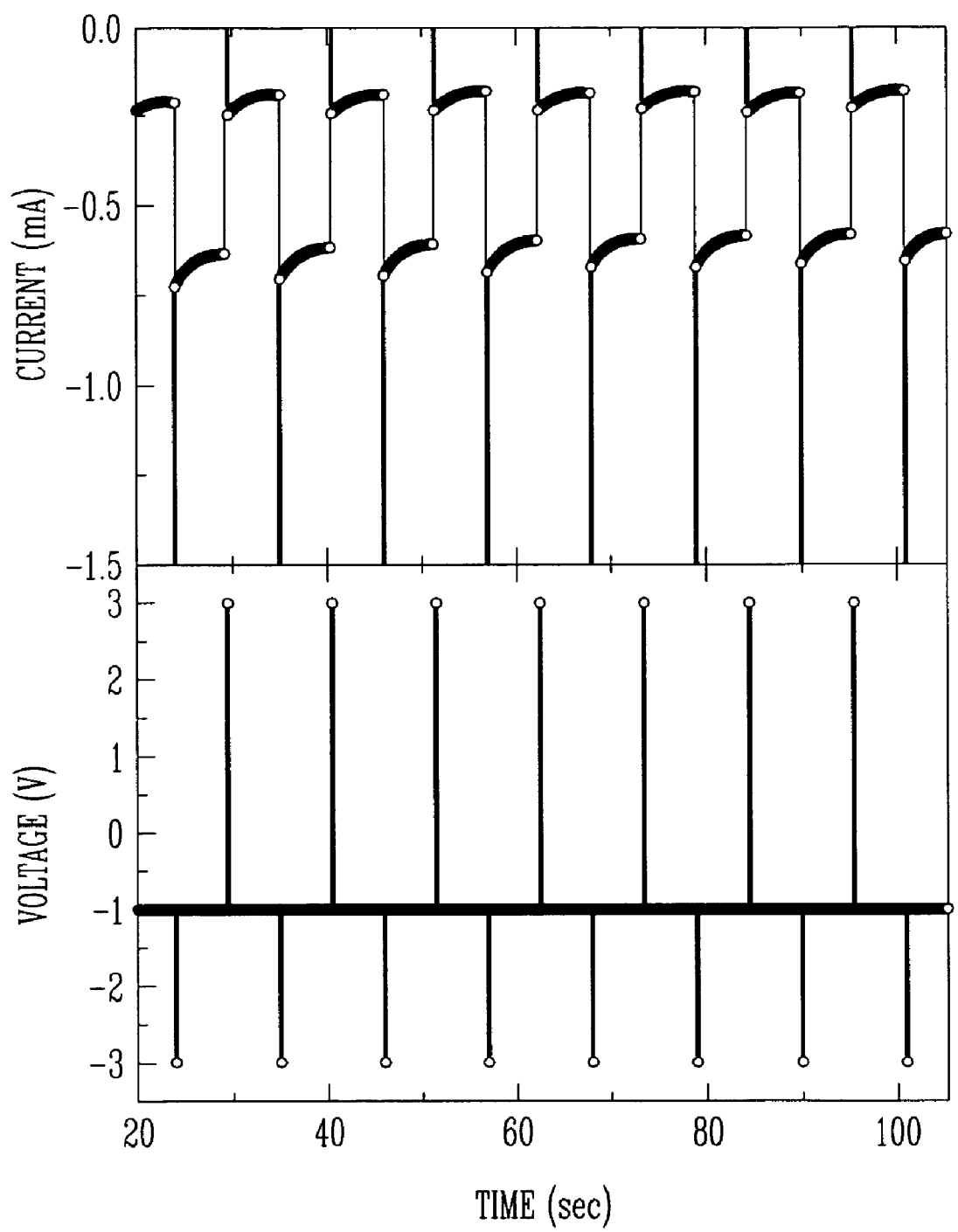
FIG. 7 is a graph showing switching characteristics of a memory device of which currents are measured while a negative voltage and a positive negative are repeatedly applied to the memory device in accordance with an embodiment of the present invention.

FIG. 7 is a graph showing switching characteristics of a memory device of which currents are measured while a negative voltage and a positive negative are repeatedly applied to the memory device in accordance with an embodiment of the present invention. Referring to FIG. 7 representing the switching characteristics of the non-volatile memory device, its horizontal axis denotes a time, and its lower vertical axis denotes a voltage and its upper vertical axis denotes a current. A current measured at −1V after a pulse of −3V is applied to the memory device is about −0.7 mA, and a current measured at −1V after a pulse of +3V is applied to the memory device is about −0.2 mA. Consequently, the memory device has a switching characteristic that the current is changed (in a range of −0.7 mA to −0.2 mA) according to the change in applied voltage.

According to the dielectric thin film having the above-described memory characteristics, that is, when dielectric materials are stacked in a plurality of layers, it can be seen that the memory effect can be found because of the (state) change in SCLC. For example, in a case of a TIO$_2$ layer formed to a thickness of 10 nm by a Metal Organic Chemical Vapor Deposition (MOCVD) method, an Atomic Layer Deposition (ALD) method, a sputtering method, a spin coating method, or the like, when a high electric field enough to cause the memory effect is applied thereto, electrical resistance changes according to the voltage pulse, so that the memory effect was significantly enhanced in the structures shown in FIGS. 1 to 3. In addition, a memory device having a dielectric thin film formed of various dielectric materials such as ZrO$_2$ and HfO$_2$ and a dielectric of a perovskite structure that does not contain Mn can also enhance the memory effect, and it can also be observed that the memory effect is enhanced according to the material added to the dielectric even when the memory effect is insignificant. For example, it can be seen that the memory effect is enhanced even when the dielectric layer uses a dielectric formed of TiO$_2$, ZrO$_2$, HfO$_2$, V$_2$O$_5$, Nb$_2$O$_5$, Ta$_2$O$_5$, NiO, PdO, or a material in which at least one of Ti, V, Cr, Mn, Fe, Co, Ni, Cu, Zn, Zr, Hf, Nb, Ta, Pd, and La group elements is added to TiO$_2$, ZrO$_2$, HfO$_2$, V$_2$O$_5$, Nb$_2$O$_5$, Ta$_2$O$_5$, NiO, or PdO, as an impurity; a dielectric of ABO$_3$ type; or a dielectric consisting of a material having a perovskite structure except the ABO$_3$ type, and impurities added to the material.

As described above, a memory device in accordance with the present invention is manufactured using a dielectric thin film having a structure where a plurality of dielectric layers are stacked, to have a simple structure compared to the conventional memory device, thereby enhancing productivity and integration density.

In addition, a memory device where dielectric layers are stacked using a trap-controlled space-charge-limited current is manufactured, so that current gain in on/off states can be enhanced compared to the conventional memory device using one dielectric layer.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A memory device comprising:
  a bottom electrode;
  one or more dielectric thin films disposed on the bottom electrode, each dielectric thin film comprising a plurality of dielectric layers with different charge trap densities from each other, wherein each of the plurality of dielectric layers is composed of:
    a dielectric formed of TiO$_2$, ZrO$_2$, HfO$_2$, V$_2$O$_5$, Nb$_2$O$_5$, Ta$_2$O$_5$, NiO, PdO, or a material in which at least one of Ti, V, Cr, Mn, Fe, Co, Ni, Cu, Zn, Zr, Hf, Nb, Ta, Pd, and La group elements is added to TiO$_2$, ZrO$_2$, HfO$_2$, V$_2$O$_5$, Nb$_2$O$_5$, Ta$_2$O$_5$, NiO, or PdO, as an impurity;
    a dielectric of ABO$_3$ type; or
    a dielectric consisting of a material having a perovskite structure, except the ABO$_3$ type, and impurities added to the material; and a top electrode disposed on the one or more dielectric thin films, the top and bottom electrodes configured to receive a voltage applied to the memory device, wherein a resistance of the one or more dielectric thin films is varied according to a voltage applied to the memory device, such that an ohmic current is generated when the applied voltage is a low voltage and a space-charge limit current is generated when the applied voltage is a high voltage, the high voltage being greater than the low voltage.

2. The memory device of claim 1, wherein different space-charge limit currents flow in the one or more dielectric thin films according to respective charge trap densities.

3. The memory device of claim 2, further comprising an impurity added to a dielectric layer of the plurality of dielectric layers to control the space-charge limit current.

4. The memory device of claim 3, wherein the space-charge limit current is given by:

$$J = \frac{9}{8}\varepsilon\mu\theta\frac{V^2}{d^3},$$

where J denotes a current density, $\in$ denotes a dielectric constant, $\mu$ denotes a charge mobility, V denoted a voltage, and d denotes a thickness, $\theta$ denotes a ratio between a free charge density and a trapped charge density.

5. The memory device of claim 1, wherein a charge trap density of each of the plurality of dielectric layers ranges from $10^{17}/cm^3$ to $10^{21}/cm^3$.

6. The memory device of claim 1, wherein each of the one or more dielectric thin films has a thickness of 3 nm to 100 nm.

7. The memory device of claim 1, wherein a dielectric constant of each of the plurality of dielectric layers ranges from 3 to 1000.

8. The memory device of claim 1, wherein the ohmic current is in proportion to the applied low voltage and the space-charge limit current is in proportion to a square of the applied high voltage.

9. A memory device comprising:

a bottom electrode;

one or more dielectric thin films disposed on the bottom electrode, each dielectric thin film comprising a plurality of dielectric layers with different charge trap densities from each other, wherein each of the plurality of dielectric layers is composed of:

a dielectric formed of $TiO_2$, $ZrO_2$, $HfO_2$, $V_2O_5$, $Nb_2O_5$, $Ta_2O_5$, NiO, PdO, or a material in which at least one of Ti, V, Cr, Mn, Fe, Co, Ni, Cu, Zn, Zr, Hf, Nb, Ta, Pd, and La group elements is added to $TiO_2$, $ZrO_2$, $HfO_2$, $V_2O_5$, $Nb_2O_5$, $Ta_2O_5$, NiO, or PdO, as an impurity; or a dielectric consisting of a material having a perovskite structure, and impurities added to the material; and a top electrode disposed on the one or more dielectric thin films, the top and bottom electrodes configured to receive a voltage applied to the memory device, wherein a resistance of the one or more dielectric thin films is varied according to a voltage applied to the memory device, such that an ohmic current is generated when the applied voltage is a low voltage and a space-charge limit current is generated when the applied voltage is a high voltage, the high voltage being greater than the low voltage.

* * * * *